US008810775B2

(12) United States Patent
Kools

(10) Patent No.: US 8,810,775 B2
(45) Date of Patent: Aug. 19, 2014

(54) EUV MIRROR MODULE WITH A NICKEL ELECTROFORMED CURVED MIRROR

(75) Inventor: Jacques Kools, Simane (FR)

(73) Assignee: Media Lario S.R.L., Bosisio Parini (LC) (IT)

( * ) Notice: Subject to any disclaimer, the term of this patent is extended or adjusted under 35 U.S.C. 154(b) by 481 days.

(21) Appl. No.: 12/799,016

(22) Filed: Apr. 16, 2010

(65) Prior Publication Data

US 2011/0255068 A1   Oct. 20, 2011

(51) Int. Cl.
| G03F 7/20 | (2006.01) |
| G02B 7/18 | (2006.01) |
| G02B 5/08 | (2006.01) |

(52) U.S. Cl.
CPC ............ *G02B 7/1815* (2013.01); *G03F 7/7015* (2013.01); *G02B 5/0891* (2013.01)
USPC ............................................. 355/67; 355/77

(58) Field of Classification Search
CPC .... G02B 5/0891; G02B 7/1815; G02B 7/182; G02B 5/10; G03F 7/7015; G03F 7/70316
See application file for complete search history.

(56) References Cited

U.S. PATENT DOCUMENTS

| 3,184,823 | A | * | 5/1965 | Little et al. ..................... 438/375 |
| 4,142,006 | A | * | 2/1979 | Choyke et al. ................. 427/162 |
| 4,386,825 | A | * | 6/1983 | Stalcup et al. ................. 359/845 |
| 4,429,953 | A |   | 2/1984 | Reidy et al. |
| 5,229,613 | A | * | 7/1993 | Pandelisev et al. ........... 250/368 |
| 7,329,014 | B2 |  | 2/2008 | Balogh et al. |
| 7,812,329 | B2 | * | 10/2010 | Bykanov et al. .......... 250/504 R |
| 8,411,815 | B2 | * | 4/2013 | Wallhead et al. ................ 378/34 |
| 2006/0000985 | A1 | * | 1/2006 | Chandhok et al. .......... 250/492.2 |
| 2007/0223096 | A1 | * | 9/2007 | O'Connor et al. ............. 359/584 |
| 2008/0023657 | A1 | * | 1/2008 | Melnychuk et al. ...... 250/504 R |
| 2009/0289205 | A1 | * | 11/2009 | Moriya et al. ............ 250/504 R |
| 2010/0007866 | A1 | * | 1/2010 | Warm et al. ...................... 355/66 |

OTHER PUBLICATIONS

Mds for Indalloy no. 2.*
Listing of MDS for Indalloy, Indium Corp, Aug. 13, 2007.*
Wang, "Joining of stainless—steel specimens with nanostructured Al/Ni foils," J. App. Phys., vol. 95, No. 1, Jan. 1, 2004, pp. 248-256.
Office Action for German Patent Application No. 10 2011 016 769.2, which is the German counterpart to the above-identified US Patent Application, Jan. 9, 2014.

* cited by examiner

*Primary Examiner* — Peter B Kim
*Assistant Examiner* — Michelle Iacoletti
(74) *Attorney, Agent, or Firm* — Opticus IP Law PLLC

(57) ABSTRACT

An EUV mirror module is disclosed that comprises a substrate with a curved upper surface and a curved electroformed mirror. A self-adjusting bonding material is disposed between the substrate and the electroformed mirror. The bonding material is flowable at a melting temperature and self-adjusts to conformally fill the region between substrate to the electroformed mirror and bond the substrate and the electroformed mirror. The substrate may have at least one cooling channel for cooling the mirror module.

15 Claims, 6 Drawing Sheets

US 8,810,775 B2

EUV MIRROR MODULE WITH A NICKEL ELECTROFORMED CURVED MIRROR

FIELD

The present disclosure relates generally to mirrors, and in particular to a an extreme ultraviolet (EUV) mirror module formed from an electroformed shell, a carrier substrate and a conductive bonding material for use in a EUV lithography system

BACKGROUND ART

EUV lithography is presently being pursued as the next generation lithography process for fabricating semiconductor circuits with linewidths below 50 nm. The EUV electromagnetic radiation has a wavelength typically in the range from 10 nm to 15 nm (e.g., 13.5 nm). While EUV lithography enables printing extremely fine features without diffraction-related distortions, it requires a set of high-precision-mirrors that combine high shape accuracy with extremely low surface roughness at the atomic level.

In addition to these stringent optical requirements, the high-precision mirrors must be compatible with operation in a high-vacuum environment. Where the high-precision mirrors are used as EUV collectors in an EUV collector system, they need to withstand an aggressive plasma environment where high thermal fluxes are present. As a consequence, the EUV mirrors must be fabricated using (ultra) high vacuum compatible materials and techniques, while also having thermal management capability for certain applications.

One common method of forming a high-precision EUV mirror is to machine and polish a relatively thick substrate. For example, a typical polished silicon, ZERODUR or silicon carbide mirror has a substrate thickness of about 5 cm to 10 cm. Another method of forming a high-precision mirror is to form a thin shell-type mirror, such as by electroforming. An electroformed mirror shell has a thickness of about 1 mm to 2 mm. These two mirror types have significantly different thermal properties, such as thermal mass, thermal conductance and coefficient of thermal expansion, as well as different mechanical properties, with the most notable being structural rigidity.

An advantage of forming a high-precision mirror using a relatively thick substrate is that its thermal and mechanical properties are generally more desirable than those of an electroformed mirror shell, which typically requires a web-like mechanical support structure. On the other hand, an advantage of forming a high-precision electroformed mirror is that the surface shape can easily be replicated using a mandrel, and the surface can be made to the high precision needed to meet stringent optical performance requirements.

Accordingly, there is a need for EUV mirror systems and methods whereby a relatively thin electroformed mirror can be used in an optical system, such as a EUV lithography system, designed to employ relatively thick conventional mirrors.

SUMMARY

Additional features and advantages of the disclosure will be set forth in the detailed description which follows, and in part will be readily apparent to those skilled in the art from that description or recognized by practicing the disclosure as described herein, including the detailed description which follows, the claims, as well as the appended drawings.

An aspect of the disclosure is an EUV mirror module that includes a substrate having a body with a curved upper surface and a electroformed mirror having front and rear curved surfaces. A self-adjusting bonding material is disposed between the substrate upper surface and the electroformed mirror rear surface. The bonding material is flowable at a melting temperature and serves to bond the substrate to the electroformed mirror at a temperature below the melting temperature.

Another aspect of the disclosure is EUV lithography system for illuminating a reflective mask. The system includes a source of EUV radiation and an EUV collector system that includes the EUV mirror module of the present disclosure. The EUV collector system is configured to receive the EUV radiation and form collected EUV radiation. The system also includes an illuminator configured to receive the collected EUV radiation and form condensed EUV radiation for illuminating the reflective reticle.

Another aspect of the disclosure is a method of forming an EUV mirror module. The method includes providing a substrate having a body with a curved upper surface, and providing an electroformed mirror having front and rear curved surfaces. The method also includes disposing a self-adjusting bonding material between the substrate upper surface and the electroformed mirror rear surface, the bonding material having a melting point. The method also includes heating the bonding material to its melting point, thereby causing the bonding material to flow between the substrate upper surface and the electroformed mirror rear surface. The method additionally includes cooling the bonding material to below its melting point, thereby forming a thermally conductive bond between the electroformed mirror and the substrate.

It is to be understood that both the foregoing general description and the following detailed description present embodiments of the disclosure, and are intended to provide an overview or framework for understanding the nature and character of the disclosure as it is claimed. The accompanying drawings are included to provide a further understanding of the disclosure, and are incorporated into and constitute a part of this specification. The drawings illustrate various embodiments of the disclosure and together with the description serve to explain the principles and operations of the disclosure.

Figure 1:
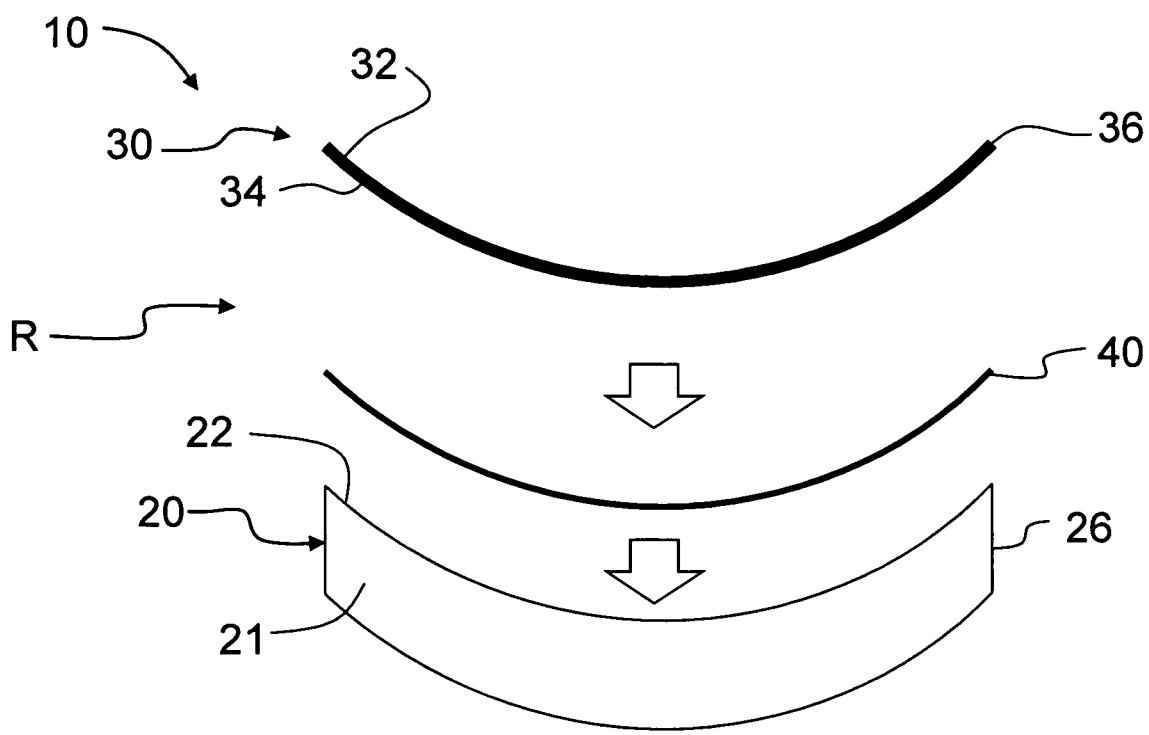
FIG. 1 is a schematic, exploded cross-sectional view of an example EUV mirror module according to the present disclosure.

The various elements depicted in the drawing are merely representational and are not necessarily drawn to scale. Certain sections thereof may be exaggerated, while others may be minimized. The drawing is intended to illustrate an example embodiment of the disclosure that can be understood and appropriately carried out by those of ordinary skill in the art.

DETAILED DESCRIPTION

Figure 2:
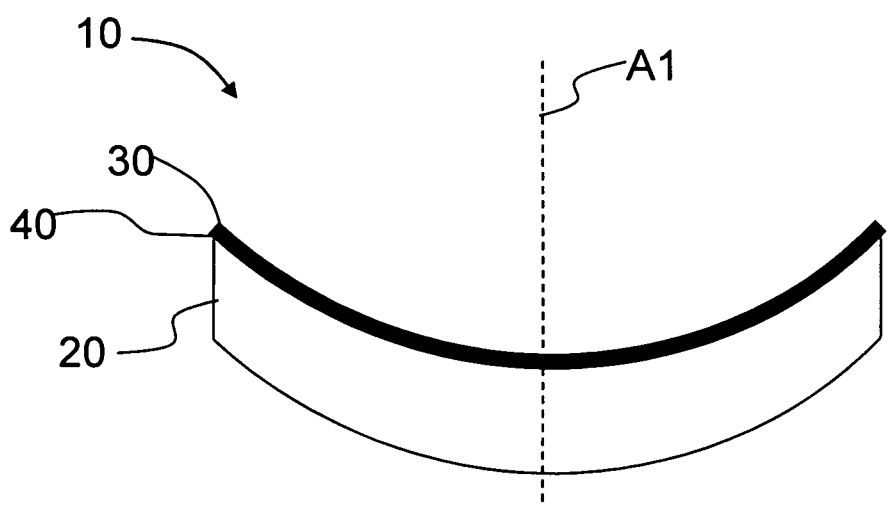
FIG. 2 shows the assembled EUV mirror module of FIG. 1.

FIG. 1 is an exploded cross-sectional view of an example EUV mirror module ("mirror module") 10 according to the present disclosure. FIG. 2 is a cross-sectional view of the assembled mirror module 10.

Mirror module 10 has a central axis A1 and includes a relatively thick carrier substrate ("substrate") 20 having a substrate body 21 with a curved upper surface 22 and an outer edge 26. Mirror module 10 also includes a relatively thin electroformed mirror 30 having a front surface 32, a rear surface 34 and an outer edge 36. Mirror module 10 also includes a self-adjusting bonding material 40 disposed between substrate upper surface 22 and electroformed mirror rear surface 34 and that bonds the substrate to the electroformed mirror.

Figure 3A:
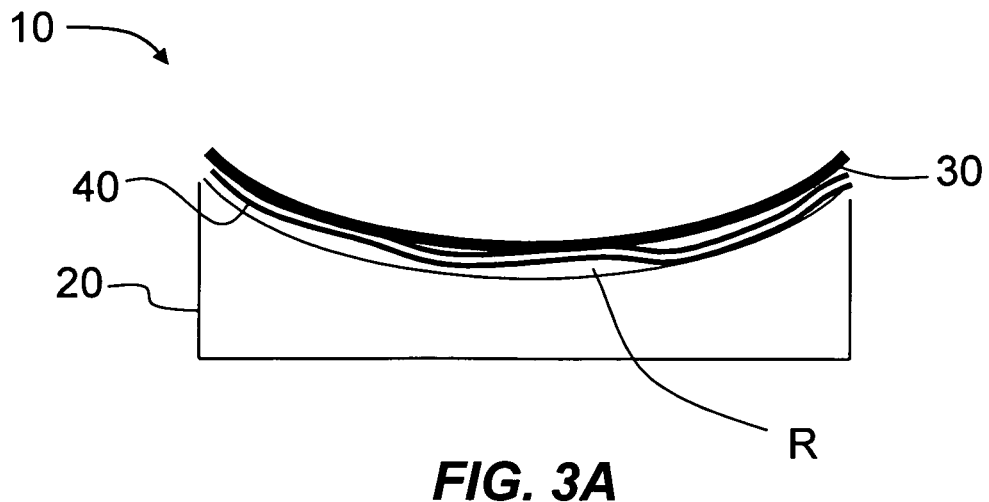
FIG. 3A is a schematic side view of the EUV mirror module showing the bonding material disposed between the electroformed mirror and the substrate in region R prior to melting and flowing the bonding material.

In an example embodiment, bonding material 40 has good thermal conductivity that provides for thermal conduction between substrate upper surface 22 and electroformed mirror rear surface 34. A region R in which bonding material 40 resides is shown between substrate upper surface 22 and mirror surface 34. This region R in practice is relatively small, and bonding material 40 ends up self-adjusting to conformally fill the region when the mirror module is assembled, as described below in connection with FIG. 3A through FIG. 3C.

In an example embodiment, mirror module 10 has substantially the same mechanical dimensions, relevant physical properties and optical function as a single, thick monolithic mirror fabricated using conventional mirror fabrication methods. An example thickness of substrate 20 is between 5 cm and 10 cm. An example thickness of electroformed mirror 30 is between 1 mm and 2 mm. An example thickness of bonding material 40 is between 10 microns and 1000 microns.

Substrate upper surface 22 need not have the exact surface figure as electroformed mirror 30 since bonding material 40 serves as an initially deformable interface layer between the substrate and the electroformed mirror, as described below. In an example, substrate upper surface 22 has an intermediate surface accuracy, e.g., 10 microns. Such a surface accuracy can be achieved with conventional machining methods at a reasonable cost. Experiments on an example mirror module 10 show that the shape accuracy of the electroformed mirror front surface 32 can be maintained much better than the surface accuracy of a machined substrate surface 22, i.e., to about 1 micron root-mean square (RMS). Thus, in an example, electroformed mirror front and rear surfaces 32 and 34 have a curvature (surface figure) that only approximately or substantially matches that of substrate surface 22.

In an example embodiment, substrate 20 and electroformed mirror 30 are made of the same material so that at least these two components of the mirror module have a substantially uniform coefficient of thermal expansion (CTE). Example materials for substrate 20 include nickel, nickel alloys, copper and copper alloys, silicon, silicon carbide and ZERODUR. Example materials for electroformed mirror 30 include nickel, nickel alloys, copper and copper alloys.

An example bonding material 40 is a low-temperature bonding solder, such as those that include indium (e.g., Indalloy 3, which is 90% In and 10% Ag). In one example, bonding material 40 is in the form of a metallic foil (e.g., an indium or an indium-based foil), e.g., 200 microns thick. Bonding material 40 preferably has a relatively low melting temperature $T_{40}$, e.g., in the range from 140° C. to 250° C. A typical melting temperature $T_{40}$ for an indium-based solder is about 150° C. A relatively low melting temperature $T_{40}$ allows for bonding material 40 to be disposed in its solid form in a region R between substrate 20 and electroformed mirror 30 at room temperature. An example of this arrangement is illustrated in the schematic cross-sectional view of FIG. 3A. Note that in the example of FIG. 3A, region R is not entirely occupied by bonding material 40 at this point. This might be the case, for example, where bonding material 40 is in the form of a metallic foil. Other example bonding materials 40 include gallium, tin and lead.

Bonding materials 40 in the form of a metallic conductive material such as Indium have the advantage of being compatible with operation in a ultra-high vacuum, or an aggressive plasma environment. Unlike organic epoxies, Indium does not degrade or outgas, even upon exposure to a plasma.

Figure 3B:
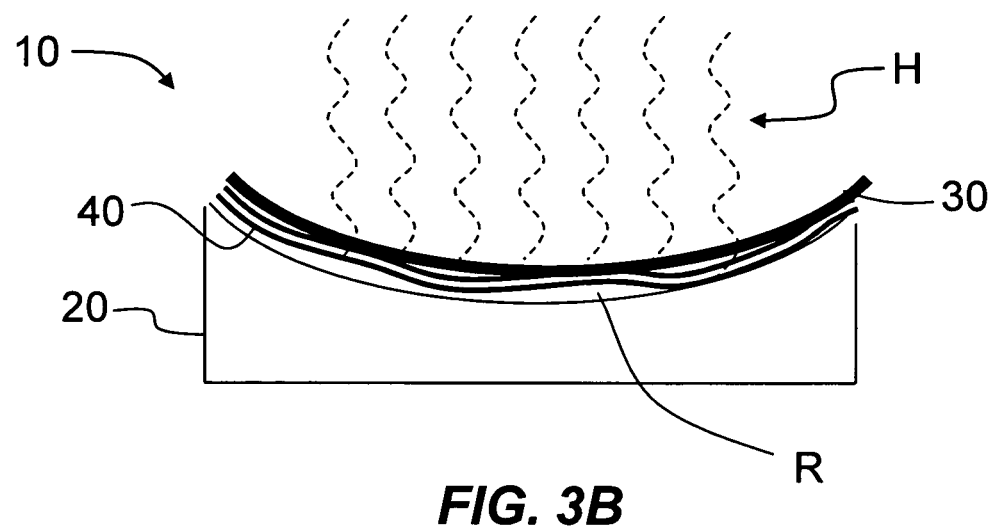
FIG. 3B is the same as FIG. 3A but showing the application of heat to the bonding material.
Figure 3C:
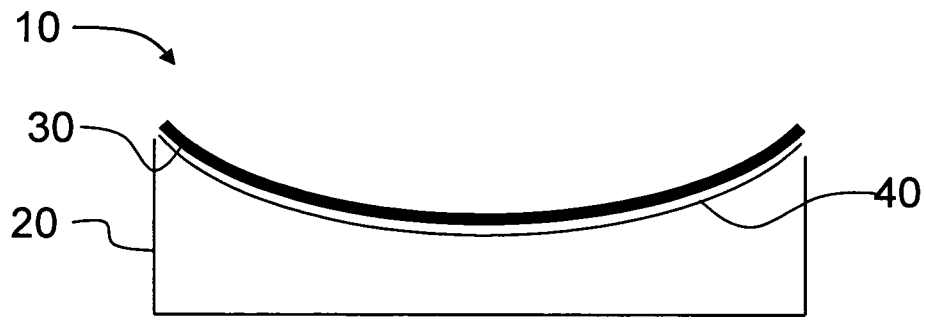
FIG. 3C is similar to FIG. 1 and shows the bonding layer having flowed and conformally filled region R.

Once bonding material 40 is so arranged, then with reference to FIG. 3B, the bonding material 40 is heated (e.g., in a vacuum oven) with heat H to its melting temperature $T_{40}$, wherein it self-adjusts my flowing and conformally filling region R between substrate 20 and electroformed mirror 30, as shown in FIG. 3C. Mirror module 10 is then allowed to cool to below melting temperature $T_{40}$, whereby the bonding material 40 returns to solid form and serves to bond the substrate 20 to the electroformed mirror 30 thereby forming the final mirror module 10.

Note that bonding material 40 when melted is capable of flowing and filling in any surface irregularities in substrate upper surface 22 and to generally make up for differences in curvature between the substrate upper surface and the curvature of electroformed mirror rear surface 34. In the embodiment where bonding material 40 has good thermal conductivity, it also serves to provide efficient thermal contact between substrate 20 and electroformed mirror 30.

During this self-adjusting step, there is no need for rigid mechanical constraints on mirror module 10 because the flowing bonding material has no stiffness. Therefore, electroformed mirror 30 will tend to adjust to its intrinsic, free-standing shape, with some predictable and systematic long-range adjustments for capillary forces and thermal expansion. The flowing bonding material 40 self-adjusts to short-range fluctuations in region R between substrate upper surface 22 and mirror surface 34.

In an example, one or both of substrate surface 22 and electroformed mirror rear surface 34 is/are treated to facilitate the bonding process, such as by depositing an adhesion or wetting layer to one or both of these surfaces.

Cooled Mirror Module

There are many optical system environments, such as those associated with EUV lithography system, laser fusion systems or synchrotron mirrors, where heating could raise the temperature of mirror module 10 to beyond the bonding material melting temperature $T_{40}$, or deform the mirror surface. Thus, with reference to FIG. 4, there is shown an example mirror module 10 similar to FIG. 1 but that further includes at least one cooling channel 100 formed in substrate 20. Where multiple cooling channels 100 are used, or where portions of the same cooling channel are adjacent, it is preferred that the cooling channels (or cooling channel portions) be sufficiently spaced apart to reduce or eliminate deleterious "print-through" of the cooling channels. Print-through is a phenomenon whereby a mirror surface is slightly deformed during operation at locations corresponding to underlying cooling channels due to a non-uniform surface temperature. The surface deformations are only present under heat load and are therefore generally are not visible by visual inspection of the mirror surface, but they can be sufficiently large to cause a deviation in the light path light incident upon the mirror to the point where the mirror performance under thermal load is seriously compromised.

Figure 5:
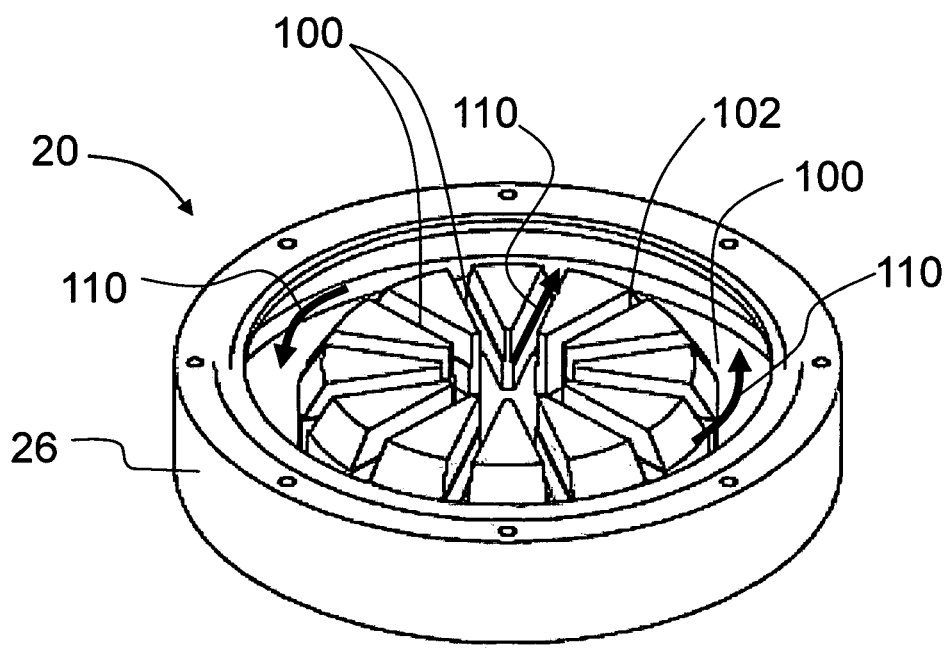
FIG. 5 is a perspective view of an example substrate having a plurality of radial cooling channels that fluidly connect to an outside cooling channel.

FIG. 5 is a perspective view of an example substrate 20 showing radially oriented cooling channels 100 formed in substrate body 21. A cooling fluid 110 (e.g., water) flows through radial cooling channels 100 radially outward from the substrate body center and the flows around an outside cooling channel 100 that fluidly connects with outer open ends 102 of the radial cooling channels to form a continuous cooling path through the substrate. This particular cooling channel configuration has the advantage of providing the highest cooling-fluid density, and smallest print-through near the mirror module center, making this design well-suited for applications where the thermal load is the highest at the center of the mirror module.

The relatively thin layer of bonding material 40 provides a sufficient thermal contact between substrate 20 and electroformed mirror 30 in the axial direction to allow for placing cooling channels 100 relatively close to substrate surface 22 while avoiding print-through. In an example, channels 100 are located a distance D1 from substrate upper surface 22, where distance D1 is in the range from 5 mm to 20 mm In addition, substrate 20 provides for efficient lateral heat diffusion that serves to mitigate print-through effects by smearing their signature. In sum, cooling channels 100 can be configured to provide for short and efficient thermal diffusion paths from electroformed mirror 30 to cooling channels 100.

Figure 4:
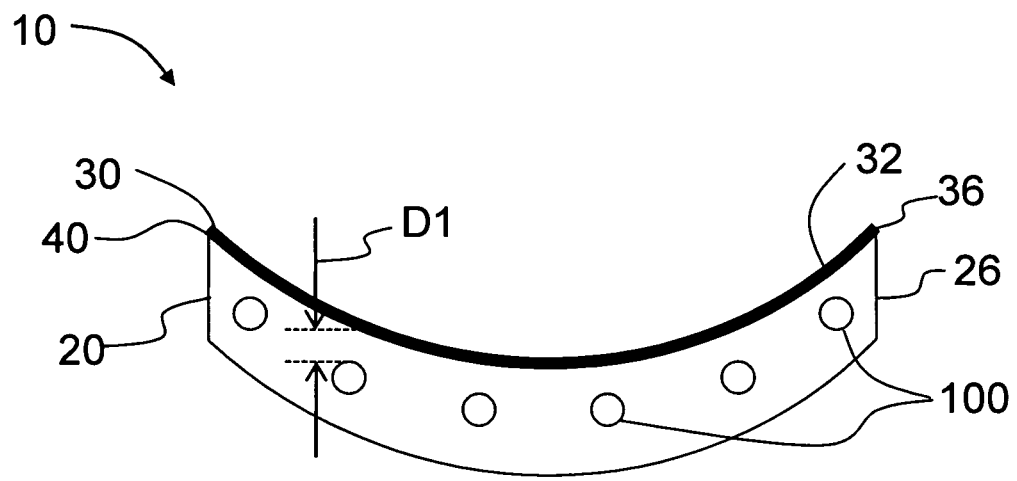
FIG. 4 is similar to FIG. 2 and illustrates an example embodiment wherein the substrate has at least one cooling channel.
Figure 6:
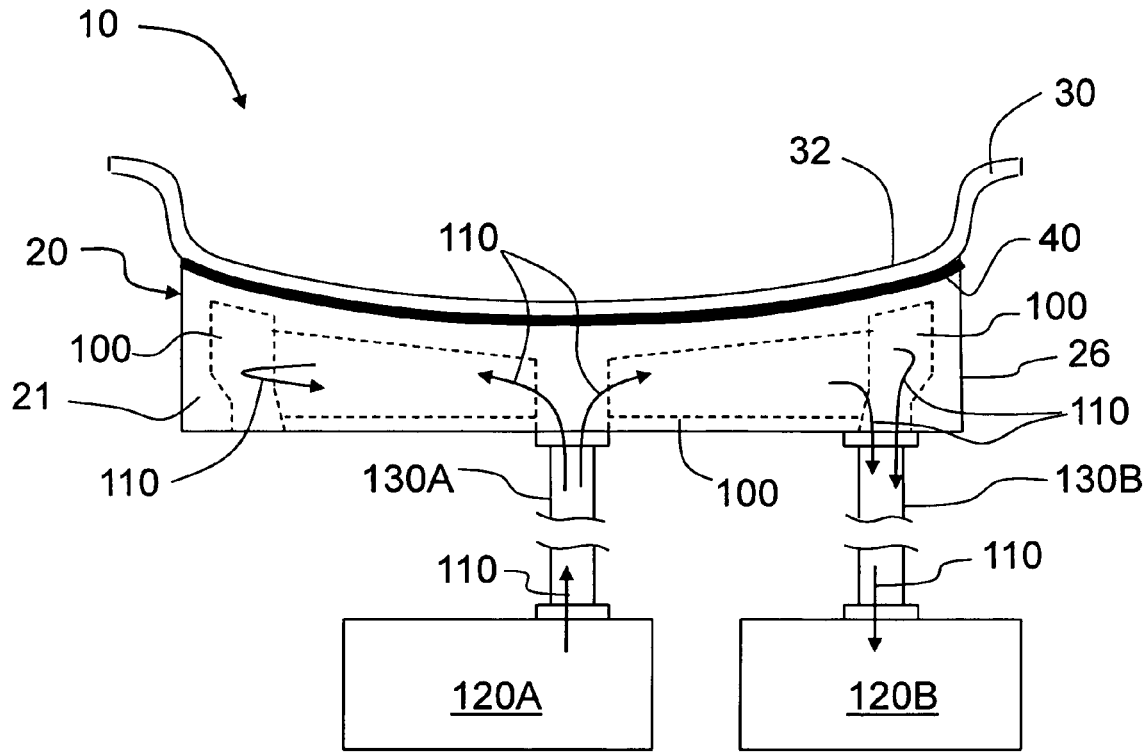
FIG. 6 is a cross-sectional view of an example EUV mirror module with input and output cooling lines respectively connected to input and output cooling fluid sources.
Figure 7:
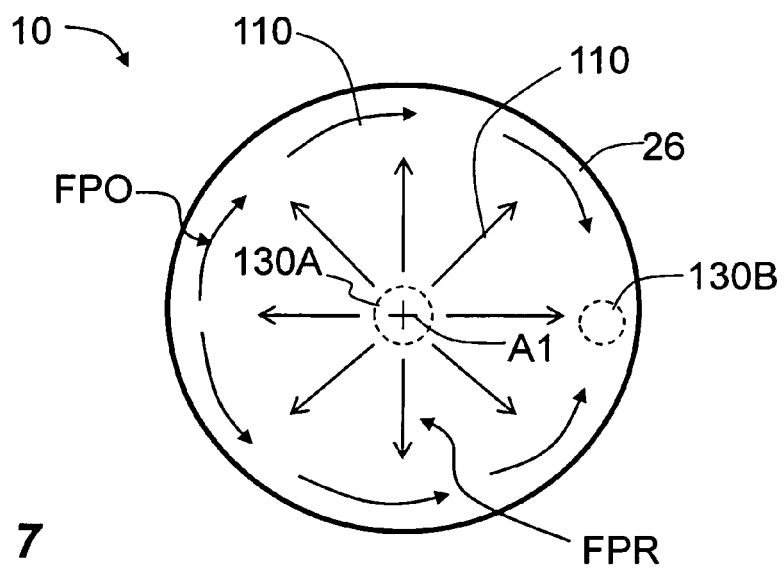
FIG. 7 is schematic top-down view of the EUV mirror module illustrating the cooling fluid flow path that includes radial flow paths (FPR) that intersect with an outside flow path (FPO)

FIG. 6 is a side view of an example mirror module 10 showing the flow path of cooling fluid 110 through substrate 20 when the substrate has the cooling channel configuration shown in FIG. 4. FIG. 7 is a top-down view of mirror module 10 schematically illustrating radial and circular cooling fluid flow paths FPR and FPO through the substrate.

Mirror module 10 of FIG. 6 includes input and output cooling-fluid units 120A and 120B that are connected to cooling channels 100 via respective cooling lines 130A and 130B and that respectively provide and receive cooling fluid 110.

Figure 8:
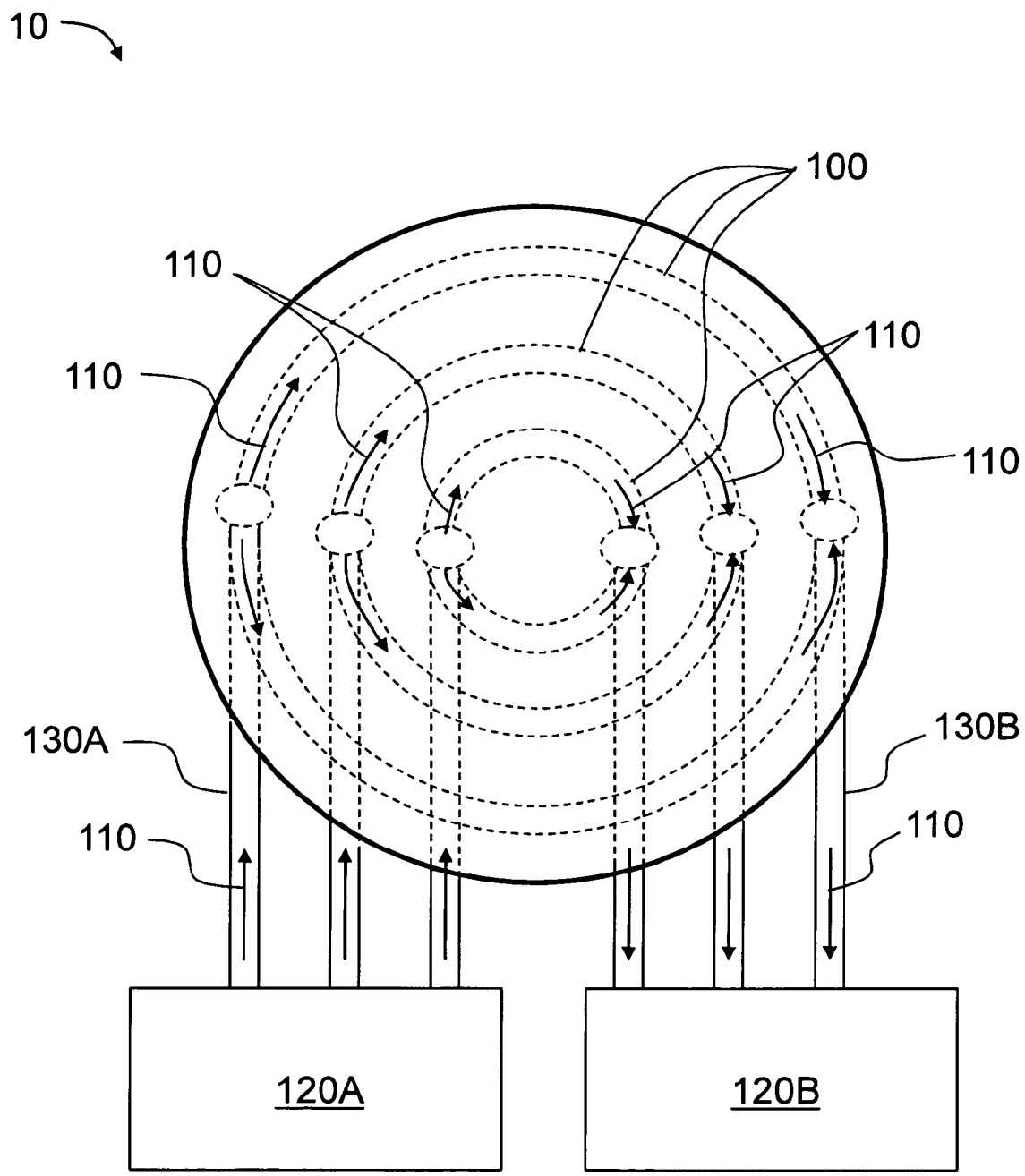
FIG. 8 is a top-down view of an example EUV mirror module having concentrically arranged cooling channels.

FIG. 8 is a top-down view of an example mirror module 10 that has concentric cooling channels 100 each connected to input and output cooling fluid units 120A and 120B. Here, the cooling fluid units serve as cooling fluid manifolds that respectively supply and receive cooling fluid 110 from each cooling channel. Cooling channels 100 need not be evenly spaced apart, and in example embodiments are more concentrated either closer the center of mirror module 10 (as defined by axis A1) or closer to the edge (as defined by substrate edge 26), depending on the thermal load distribution over the mirror module.

For example, consider an application where mirror module 10 is used to reflect a collimated and substantially uniform light beam of high intensity that subjects the mirror module 10 to a substantially uniform heat load. In this case, cooling channels 100 are preferably configured to provide uniform cooling over most of if not the entire area of electroformed mirror front surface 32. On the other hand, consider an application where mirror module 10 is used to reflect a substantially non-uniform light beam of high intensity that subjects the mirror module to a substantially non-uniform heat load. In this case, cooling channels 100 are preferably configured to provide non-uniform cooling over most if not all of the area of electroformed mirror front surface 32 in a manner that corresponds to the anticipated non-uniform thermal load.

EUV Lithography System

Figure 9:
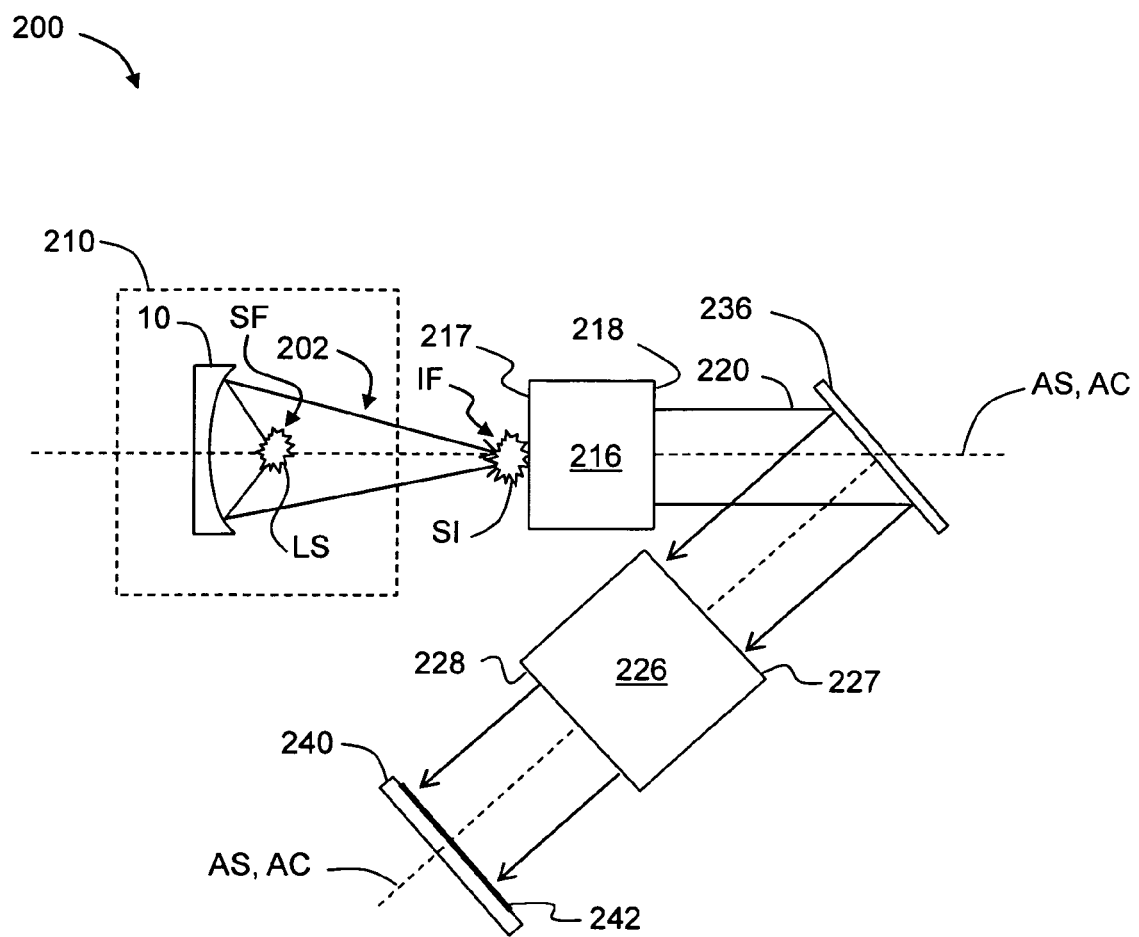
FIG. 9 is a schematic diagram of an example EUV lithography system that employs the EUV mirror module of the present disclosure.

FIG. 9 is an example EUV lithography system ("system") 200 according to the present disclosure. Example EUV lithography systems are disclosed, for example, in U.S. Patent Applications No. US2004/0265712A1, US2005/0016679A1 and US2005/0155624A1, which Applications are incorporated herein by reference.

System 200 includes a system axis AS and EUV light source LS, such as a hot plasma source, that emits working EUV radiation 202 at $\lambda=13.5$ nm. EUV radiation 202 is generated, for example, by an electrical discharge source (e.g., a discharged produced plasma, or DPP source), or by a laser beam (laser-produced plasma, or LPP source) on a target of Lithium, Xenon or Tin. EUV radiation 202 emitted from such a LPP source may be roughly isotropic and, in current DPP sources, is limited by the discharge electrodes to a source emission angle of about 60° degrees or more from optical axis AS. It is noted that the isotropy of the LPP source that uses target pellets will depend on the mass of the target pellet. For relatively high-mass targets, the emission is anisotropic, with most of the emerging radiation headed back toward the laser beam due to absorption in the forward direction by the target mass. For a low mass LPP target, which is almost entirely ionized by the laser, the emission is much closer to isotropic.

System 200 includes a mirror module 10 as described above that serves as an EUV collector system 210. Collector system 210 is arranged adjacent and downstream of EUV light source LS, with collector axis AC lying along system axis AS. EUV collector system 210 collects EUV working radiation 202 from EUV light source LS located at source focus SF and forms intermediate source image SI at intermediate focus IF.

An illumination system 216 with an input end 217 and an output end 218 is arranged along system axis AS and adjacent and downstream of EUV collector system 210, with the input end 217 adjacent the EUV collector system. Illumination system 216 receives at input end 217 EUV radiation 202 from intermediate source image SI and outputs at output end 218 a substantially uniform EUV radiation beam 220 (i.e., condensed EUV radiation). Where system 200 is a scanning type system, EUV radiation beam 220 is typically formed as a substantially uniform line of EUV radiation 202 at reflective reticle 236 that scans over the reticle.

A projection optical system 226 is arranged along (folded) system axis AS downstream of illumination system 216. Projection optical system 226 has an input end 227 facing illumination system output end 218, and an opposite output end 228. A reflective reticle 236 is arranged adjacent the projection optical system input end 227 and a semiconductor wafer 240 is arranged adjacent projection optical system output end 228. Reticle 236 includes a pattern (not shown) to be transferred to wafer 240, which includes a photosensitive coating (e.g., photoresist layer) 242.

In operation, the uniformized EUV radiation beam 220 irradiates reticle 236 and reflects therefrom, and the pattern thereon is imaged onto photosensitive surface 242 of wafer 240 by projection optical system 226. In a scanning system 200, the reticle image scans over the photosensitive surface to form the pattern over the exposure field. Scanning is typically achieved by moving reticle 236 and wafer 240 in synchrony.

Once the reticle pattern is imaged and recorded on wafer 240, the patterned wafer 240 is then processed using standard photolithographic and semiconductor processing techniques to form integrated circuit (IC) chips.

Note that in general the components of system 200 are shown lying along a common folded axis AS in FIG. 9 for the sake of illustration. One skilled in the art will understand that there can be an offset between entrance and exit axes for the various components such as for illumination system 216 and for projection optical system 226.

EUV Mirror Module Advantages

In the past, replacing a conventional mirror with an electroformed mirror in a high-performance optical system required substantial system-level changes. At a minimum, the mechanical mounting structure for the mirror needed to be changed. If an active thermal control system was also used, this control system needed to be modified to take into account the considerably different thermal mass and backside infrared reflectivity coefficient. As a consequence, it was highly likely that other system components, such as the mounting stage, the heater assembly and the control electronics would also need to be substantially modified or changed altogether.

Mirror module 10 greatly simplifies the proposition of changing out the conventional mirror with an electroformed mirror in an optical system. Mirror module 10 can be formed to have dimensions, a thermal mass, a backside reflectivity coefficient and other properties that are very close to those of a particular conventional mirror. For example, in the case of a mirror collector for a laser-produced plasma (LPP) light source, 96% to 99% of the volume of the mirror module can be made very close to or identical to that that of the counterpart conventional mirror. Further, the mirror module thermal properties can be made sufficiently close to that of the counterpart conventional mirror so that the thermal performance of the two mirrors in the optical system would be substantially the same. Thus, from an optical-system-level point of view, a mirror module of the present disclosure can be used in an optical system with very little difference and with minimal adjustment or modification of the optical system and its components.

Also, because precision machining and super-polishing are dominant factors in the cost of conventional mirrors, use of a mirror module can be cost effective for many optical system applications that presently require conventional mirrors.

Accordingly, cost-effective electroformed mirror-based modules can be used as spare parts of optical systems that were originally designed to use a conventional mirror.

Another advantage of mirror module 10 is that the use of a low-temperature bonding material 40 allows one to quickly disassemble the mirror module by de-bonding substrate 20 from electroformed mirror 30 by heating the mirror module to a moderate temperature. This disassembly may be performed, for example, at the end of the lifetime of the electroformed mirror 30 or its reflective coating so that a new electroformed mirror may be bonded to substrate 20 to form a refurbished mirror module.

It will be apparent to those skilled in the art that various modifications and variations can be made to the present disclosure without departing from the spirit and scope of the disclosure. Thus it is intended that the present disclosure cover the modifications and variations of this disclosure provided they come within the scope of the appended claims and their equivalents.

What is claimed is:

1. An extreme ultraviolet (EUV) mirror module for use with EUV radiation, comprising:
    a substrate made of either nickel, nickel alloy, silicon or silicon-carbide and having a body with a curved upper surface that has surface irregularities, a first curvature and a first surface accuracy, the substrate having at least one cooling channel having cooling channel portions;
    a nickel electroformed mirror having front and rear curved surfaces and having a thickness of between 1 mm and 2 mm, the front and rear curved surfaces having a second curvature with a second surface accuracy that is greater than the first surface accuracy, wherein the second surface accuracy is at least 1 micron root-mean square (RMS), and wherein the first curvature approximately matches the second curvature; and
    a self-adjusting metallic conductive bonding material disposed in a region between the substrate curved upper surface and the electroformed mirror curved rear surface, the bonding material being flowable at a melting temperature to have a thickness between 10 microns and 1000 microns that conformally fills the region and fills the substrate surface irregularities, and bonds the substrate to the electroformed mirror at a temperature below the melting temperature while establishing thermal contact between the substrate and the electroformed mirror.

2. The EUV mirror module of claim 1, wherein the substrate and the electroformed mirror are formed from the same material.

3. The EUV mirror module of claim 1, wherein the metallic conductive bonding material comprises at least one of indium, gallium, tin and lead.

4. The EUV mirror module of claim 1, wherein the melting temperature of the metallic conductive bonding material is between 140° C. and 250° C.

5. The EUV mirror module of claim 1, wherein the substrate has a thickness of between 5 cm and 10 cm.

6. The EUV mirror module of claim 1, wherein the at least one cooling channel includes radially arranged cooling channels.

7. The EUV mirror module of claim 1, wherein the at least one cooling channel is located a distance D1 from the substrate upper surface, wherein distance D1 is in the range from 5 to 20 mm.

8. An extreme ultraviolet (EUV) lithography system for illuminating a reflective reticle, comprising:
    a source of EUV radiation;
    an EUV collector system that includes the EUV mirror module of claim 1, wherein the EUV collector system is configured to receive the EUV radiation and form collected EUV radiation; and
    an illuminator configured to receive the collected EUV radiation and form condensed EUV radiation for illuminating the reflective reticle.

9. The EUV lithography system of claim 8 for forming a patterned image on a photosensitive semiconductor wafer, further comprising:
    a projection optical system arranged downstream of the reflective reticle and configured to receive reflected EUV radiation from the reflective reticle and form therefrom the patterned image on the photosensitive semiconductor wafer.

10. A method of forming an extreme ultraviolet (EUV) mirror module, comprising:
    providing a substrate having a body made of either nickel, nickel alloy, silicon or silicon-carbide and having a curved upper surface with surface irregularities and a first curvature with a first curvature accuracy;

forming a mirror by electroforming, the electroformed mirror having front and rear curved surfaces and having a thickness of between 1 mm and 2 mm, the front and rear curved surfaces having a second curvature with a second surface accuracy that is greater than the first surface accuracy, wherein the second surface accuracy is at least 1 micron root-mean square (RMS), and wherein the first curvature approximately matches the second curvature;

disposing a self-adjusting metallic conductive bonding material in a region between the substrate upper surface and the electroformed mirror rear surface, the bonding material having a melting point;

heating the metallic conductive bonding material to its melting point, thereby causing the metallic conductive bonding material to flow in the region to a thickness of between 10 microns and 1000 microns and to conformally fill the region and fill the substrate surface irregularities; and cooling the metallic conductive bonding material to below its melting point, thereby forming a thermally conductive bond between the electroformed mirror and the substrate.

11. The method of claim 10, wherein the metallic conductive bonding material includes at least one of indium, gallium, tin and lead.

12. The method of claim 10, wherein the melting temperature is between 140° C. and 250° C.

13. The method of claim 10, further comprising forming at least one cooling channel in the substrate body and flowing a cooling fluid through the at least one cooling channel.

14. The method of claim 13, further comprising forming a plurality of radial cooling lines in the substrate body.

15. The method of claim 10, further comprising forming the electroformed mirror and the substrate from the same material.

* * * * *